United States Patent
Oh et al.

(10) Patent No.: US 8,515,087 B2
(45) Date of Patent: Aug. 20, 2013

(54) APPARATUS FOR PROCESSING AN AUDIO SIGNAL AND METHOD THEREOF

(75) Inventors: Hyen-O Oh, Seoul (KR); Alexis Favrot, Suhr (CH); Christof Faller, St-Sulpice (CH); Myung Hoon Lee, Seoul (KR); Jong Ha Moon, Seoul (KR)

(73) Assignee: LG Electronics Inc., Seoul (KR)

(*) Notice: Subject to any disclaimer, the term of this patent is extended or adjusted under 35 U.S.C. 154(b) by 619 days.

(21) Appl. No.: 12/719,388

(22) Filed: Mar. 8, 2010

(65) Prior Publication Data

US 2010/0310085 A1 Dec. 9, 2010

Related U.S. Application Data

(60) Provisional application No. 61/158,388, filed on Mar. 8, 2009, provisional application No. 61/164,459, filed on Mar. 29, 2009.

(51) Int. Cl.
| | |
|---|---|
| G10K 11/1784 | (2006.01) |
| H03G 5/165 | (2006.01) |
| H03G 3/001 | (2006.01) |
| H03G 1/02 | (2006.01) |
| H03G 7/002 | (2006.01) |
| G10K 11/1788 | (2006.01) |
| G10L 21/0208 | (2013.01) |
| G10K 11/178 | (2006.01) |
| H03G 5/16 | (2006.01) |
| H03G 3/00 | (2006.01) |
| H03G 7/00 | (2006.01) |

(52) U.S. Cl.
CPC .......... *G10K 11/1784* (2013.01); *H03G 5/165* (2013.01); *H03G 3/001* (2013.01); *H03G 1/02* (2013.01); *H03G 7/002* (2013.01); *G10K 11/1788* (2013.01); *G10L 21/0208* (2013.01)
USPC ........ 381/71.11; 381/103; 381/104; 381/105; 381/106; 381/107; 381/71.1; 381/94.1

(58) Field of Classification Search
USPC ................ 381/71.1, 71.11, 103–108, 94.1
See application file for complete search history.

(56) References Cited

U.S. PATENT DOCUMENTS

| | | | |
|---|---|---|---|
| 4,490,843 | A | 12/1984 | Bose et al. |
| 4,739,514 | A | 4/1988 | Short et al. |

(Continued)

FOREIGN PATENT DOCUMENTS

| | | |
|---|---|---|
| DE | 33 21 225 C2 | 12/1983 |
| EP | 1835487 A2 | 5/2004 |
| EP | 1 729 287 A1 | 12/2006 |
| WO | WO 87/00366 A1 | 1/1987 |
| WO | WO 94/23419 A1 | 10/1994 |
| WO | WO 96/24127 A1 | 8/1996 |
| WO | WO 97/11572 A1 | 3/1997 |
| WO | WO 02/21687 A2 | 3/2002 |
| WO | WO 2005/036922 A1 | 4/2005 |
| WO | WO 2006/106479 A2 | 10/2006 |
| WO | WO 2006/111370 A1 | 10/2006 |
| WO | WO 2008/155708 A1 | 12/2008 |

OTHER PUBLICATIONS

Gazor et al., "Speech Enhancement Employing Laplacian-Gaussian Mixture", IEEE Transactions on Speech and Audio Processing, vol. 13, No. 5, Sep. 2005, pp. 896-904.

Sugiyama, "Single-Channel Impact-Noise Suppression with no Auxiliary Information for its Detection", 2007 IEEE Workshop on Applications of Signal Processing to Audio and Acoustics, Oct. 21-24, 2007, New Paltz, NY, pp. 127-130.

*Primary Examiner* — Duc Nguyen
*Assistant Examiner* — George Monikang
(74) *Attorney, Agent, or Firm* — Birch, Stewart, Kolasch & Birch, LLP

(57) ABSTRACT

A method of processing an audio signal is disclosed. The present invention includes receiving, by an audio processing apparatus, an input signal; estimating indicator function using a signal power of the input signal; obtaining an adapted filter using the indicator function and an equalization filter; and, generating an output signal by applying the adapted filter to the input signal.

8 Claims, 17 Drawing Sheets

(56) References Cited

U.S. PATENT DOCUMENTS

| | | |
|---|---|---|
| 5,768,473 A | 6/1998 | Eatwell et al. |
| 6,122,384 A | 9/2000 | Mauro |
| 6,965,676 B1 | 11/2005 | Allred |
| 7,263,193 B2 * | 8/2007 | Abel ................................ 381/1 |
| 2001/0022812 A1 | 9/2001 | Ise et al. |
| 2003/0035549 A1 | 2/2003 | Bizjak et al. |
| 2005/0096762 A2 | 5/2005 | Claesson |
| 2005/0228651 A1 | 10/2005 | Wang et al. |
| 2006/0106472 A1 | 5/2006 | Romesburg et al. |
| 2006/0291681 A1 * | 12/2006 | Klinkby et al. ................ 381/318 |
| 2007/0124139 A1 | 5/2007 | Chen |
| 2008/0253586 A1 | 10/2008 | Wei |
| 2010/0111339 A1 * | 5/2010 | Sira ................................ 381/318 |

\* cited by examiner

APPARATUS FOR PROCESSING AN AUDIO SIGNAL AND METHOD THEREOF

CROSS-REFERENCE TO RELATED APPLICATION

This application claims the benefit of U.S. Provisional Application No. 61/158,388 filed on Mar. 8, 2009 and U.S. Provisional Application No. 61/164,459, filed on Mar. 29, 2009, which are hereby incorporated by reference.

BACKGROUND OF THE INVENTION

1. Field of the Invention

The present invention relates to an apparatus for processing an audio signal and method thereof. Although the present invention is suitable for a wide scope of applications, it is particularly suitable for processing an audio signal.

2. Discussion of the Related Art

Generally, an audio signal is outputted via a loud speaker provided to a television set, a portable device or the like or a headset and the like. Before the audio signal is outputted via a speaker or the like, an audio processor can perform such processing as noise canceling, normalizing, volume adjusting and the like on the audio signal.

However, according to a related art, such processing as volume control, bass control and the like is performed individually and independently. Since sound intensity based on a sound pressure level is considered in performing the volume control, it may cause a problem that loudness of the sound actually falling on human ears makes a difference unintentionally.

Moreover, in performing the bass control, if a frequency response of a loud speaker is low for a low frequency or bass is excessively boosted, it may cause a problem that a signal is distorted.

SUMMARY OF THE INVENTION

Accordingly, the present invention is directed to an apparatus for processing an audio signal and method thereof that substantially obviate one or more of the problems due to limitations and disadvantages of the related art.

An object of the present invention is to provide an apparatus for processing an audio signal and method thereof, by which a volume can be controlled using loudness of sound actually audible to a human for each sound pressure level.

Another object of the present invention is to provide an apparatus for processing an audio signal and method thereof, by which a volume can be controlled per frequency band using an absolute threshold of hearing. In this case, the absolute threshold of hearing is a minimum human-recognizable sound pressure level (SPL)

Another object of the present invention is to provide an apparatus for processing an audio signal and method thereof, by which a volume can be controlled in a manner of applying both a linear gain for adjusting a gain in proportion to a user input and a non-linear gain for adjusting a gain on the basis of an absolute threshold of hearing.

A further object of the present invention is to provide an apparatus for processing an audio signal and method thereof, by which an adaptive filter can be applied to improve a bass if a frequency response of a loudspeaker is low.

Additional features and advantages of the invention will be set forth in the description which follows, and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, a method for processing an audio signal, comprising: receiving, by an audio processing apparatus, an input signal; receiving user gain input; generating a linear gain factor and a non-linear gain factor using the user gain input; modifying the non-linear gain factor using absolute threshold of hearing and power of the input signal to generate a modified non-linear gain factor; and, applying the linear gain factor and the modified non-linear gain factor to the audio signal is provided.

According to the present invention, the non-linear gain factor and the linear gain factor are generated based on whether the user gain input is lower or higher than at least one of a low reference value and a high reference value.

According to the present invention, when the user gain input is lower than a low reference value, the non-linear gain factor is generated as a fixed value, and the linear gain factor is generated using the user gain input, and, when the user gain input is equal to or higher than a low reference value, the non-linear gain factor is generated using the user gain input and the linear gain factor is generated as a fixed value.

According to the present invention, the fixed value is determined according to at least one of the low reference value and a high reference value.

According to the present invention, when the user gain input is equal or higher than a high reference value, the non-linear gain factor is equal to one and the linear gain factor is equal to the user gain input.

According to the present invention, when the user gain input is equal or higher than a low reference value, the non-linear gain factor is equal to the user gain input and the linear gain factor is equal to one.

To further achieve these and other advantages and in accordance with the purpose of the present invention, an apparatus for processing an audio signal, comprising: a receiving unit receiving an input signal; a user gain receiving part receiving user gain input; a gain splitting part generating a linear gain factor and a non-linear gain factor using the user gain input; a non-linear gain modifying part modifying the non-linear gain factor using absolute threshold of hearing and power of the input signal to generate a modified non-linear gain factor; and, a gain applying part applying the linear gain factor and the modified non-linear gain factor to the audio signal is provided.

According to the present invention, the non-linear gain factor and the linear gain factor are generated based on whether the user gain input is lower or higher than at least one of a low reference value and a high reference value.

According to the present invention, when the user gain input is lower than a low reference value, the non-linear gain factor is generated as a fixed value, and the linear gain factor is generated using the user gain input, and, when the user gain input is equal to or higher than a low reference value, the non-linear gain factor is generated using the user gain input, and the linear gain factor is generated as a fixed value.

According to the present invention, the fixed value is determined according to at least one of the low reference value and a high reference value.

According to the present invention, when the user gain input is equal or higher than a high reference value, the non-linear gain factor is equal to one and the linear gain factor is equal to the user gain input.

According to the present invention, when the user gain input is equal or higher than a low reference value, the non-linear gain factor is equal to the user gain input and the linear gain factor is equal to one.

To further achieve these and other advantages and in accordance with the purpose of the present invention, a computer-readable medium having instructions stored thereon, which, when executed by a processor, causes the processor to perform operations, comprising: receiving, by an audio processing apparatus, an input signal; receiving user gain input; generating a linear gain factor and a non-linear gain factor using the user gain input; modifying the non-linear gain factor using absolute threshold of hearing and power of the input signal to generate a modified non-linear gain factor; and, applying the linear gain factor and the modified non-linear gain factor to the audio signal is provided.

To further achieve these and other advantages and in accordance with the purpose of the present invention, an apparatus for processing an audio signal, a method for processing an audio signal, comprising: receiving, by an audio processing apparatus, an input signal; estimating indicator function using a signal power of the input signal; obtaining an adapted filter using the indicator function and an equalization filter; and, generating an output signal by applying the adapted filter to the input signal is provided.

According to the present invention, the indicator function is for headroom for a loudspeaker.

According to the present invention, the indicator function is estimated further using a maximum power and a minimum power.

According to the present invention, when the signal power is greater than the maximum power, the adapted filter corresponds to a unity filter, when the signal power is equal to or smaller than the maximum power and greater than the minimum power, the adapted filter corresponds to a combination of the unity filter and the equalization filter, and when the signal power is equal to or smaller than the minimum power, the adapted filter corresponds to the equalization filter.

According to the present invention, the signal power is generated using a weight filter and the input signal.

According to the present invention, the indicator function ranges from zero to one.

To further achieve these and other advantages and in accordance with the purpose of the present invention, an apparatus for processing an audio signal, comprising: a receiving part receiving, by an audio processing apparatus, an input signal; an indicator function estimating part estimating indicator function using a signal power of the input signal; a filter obtain part obtaining an adapted filter using the indicator function and an equalization filter; and, a filter applying part generating an output signal by applying the adapted filter to the input signal is provided.

According to the present invention, the indicator function is estimated further using headroom for a loudspeaker.

According to the present invention, the indicator function is estimated further using a maximum power and a minimum power.

According to the present invention, when the signal power is greater than the maximum power, the adapted filter corresponds to a unity filter, when the signal power is equal to or smaller than the maximum power and greater than the minimum power, the adapted filter corresponds to a combination of the unity filter and the equalization filter, and when the signal power is equal to or smaller than the minimum power, the adapted filter corresponds to the equalization filter.

According to the present invention, the signal power is generated using a weight filter and the input signal.

According to the present invention, the indicator function ranges from zero to one.

To further achieve these and other advantages and in accordance with the purpose of the present invention, a computer-readable medium having instructions stored thereon, which, when executed by a processor, causes the processor to perform operations, comprising: receiving, by an audio processing apparatus, an input signal; estimating indicator function using a signal power of the input signal; obtaining an adapted filter using the indicator function and an equalization filter; and, generating an output signal by applying the adapted filter to the input signal is provided.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the preferred embodiments of the present invention, examples of which are illustrated in the accompanying drawings. First of all, terminologies or words used in this specification and claims are not construed as limited to the general or dictionary meanings and should be construed as the meanings and concepts matching the technical idea of the present invention based on the principle that an inventor is able to appropriately define the concepts of the terminologies to describe the inventor's invention in best way. The embodiment disclosed in this disclosure and configurations shown in the accompanying drawings are just one preferred embodiment and do not represent all technical idea of the present invention. Therefore, it is understood that the present invention covers the modifications and variations of this invention provided they come within the scope of the appended claims and their equivalents at the timing point of filing this application.

According to the present invention, terminologies not disclosed in this specification can be construed as the following meanings and concepts matching the technical idea of the present invention. Specifically, 'information' in this disclosure is the terminology that generally includes values, parameters, coefficients, elements and the like and its meaning can be construed as different occasionally, by which the present invention is non-limited.

In this disclosure, an audio signal indicates a signal identifiable via an auditory sense to be discriminated from a video signal in a broad sense. In a narrow sense, the audio signal is a signal having no speech property or a less speech property to be discriminated from a speech signal. According to the present invention, an audio signal needs to be interpreted in a broad sense but can be understandable as a narrow-sense audio signal in case of being discriminated from a speech signal.

Figure 1:
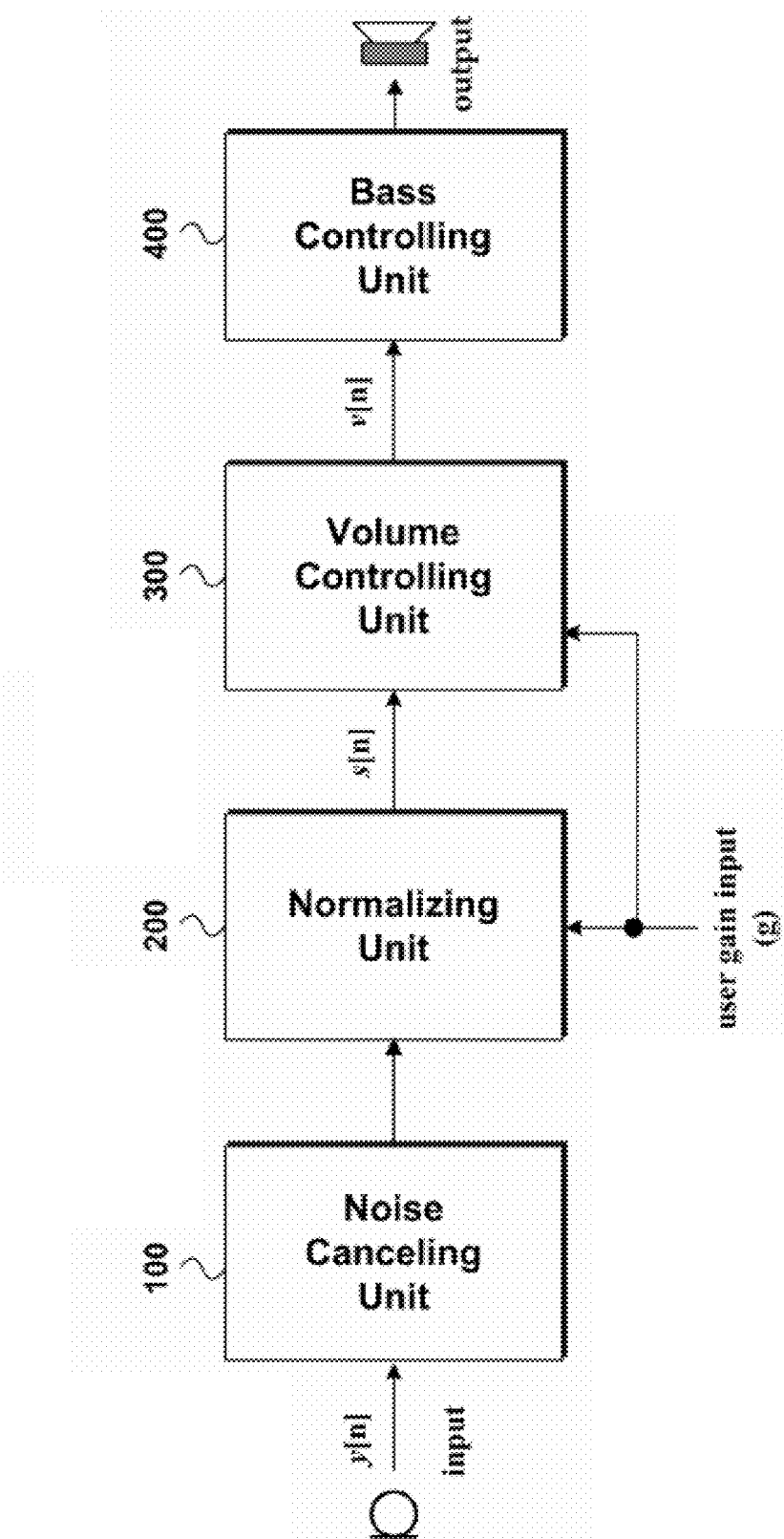
FIG. 1 is a block diagram of an audio signal processing apparatus according to an embodiment of the present invention.

FIG. 1 is a block diagram of an audio signal processing apparatus according to an embodiment of the present invention.

Referring to FIG. 1, an audio signal processing apparatus according to an embodiment of the present invention includes at least one of a volume controlling unit 300 and a bass controlling unit 400 and is able to further include a noise canceling unit 100 and a normalizing unit 200.

The noise canceling unit 100 detects or estimates the noise contained in an audio signal for an input audio signal y[n]. Based on the contained extent of the noise, the noise canceling unit 100 determines a gain per time or frequency and then applies the determined gain to the audio signal.

The normalizing unit 200 controls a dynamic range of an input signal by normalizing the input audio signal y[n] or a signal through the noise canceling unit 100 based on a user gain input (g). Further, the normalizing unit 200 is able to adaptively adjust a maximum dynamic range and a local dynamic range of an input signal. In this case, the user gain input is information inputted by a ser or device setting information and may include a value corresponding to a full-band gain (e.g., 10 dB irrespective of a frequency band).

The volume controlling unit 300 controls a volume for the noise-cancelled signal, the normalized signal s(n) or the input signal y[n] based on the user gain input (g). In doing so, it is particularly able to further use an absolute hearing threshold $P_H$ in a manner of modifying the user gain input (g) and then applying the modified input to a signal. And, the relevant details shall be described with reference to FIGS. 2 to 10 later.

The bass controlling unit 400 generates an output signal by enhancing the bass in a manner of applying an adaptive filter to the volume control completed signal v(n). And, the relevant details shall be described with reference to FIGS. 11 to 15 later.

Figure 2:
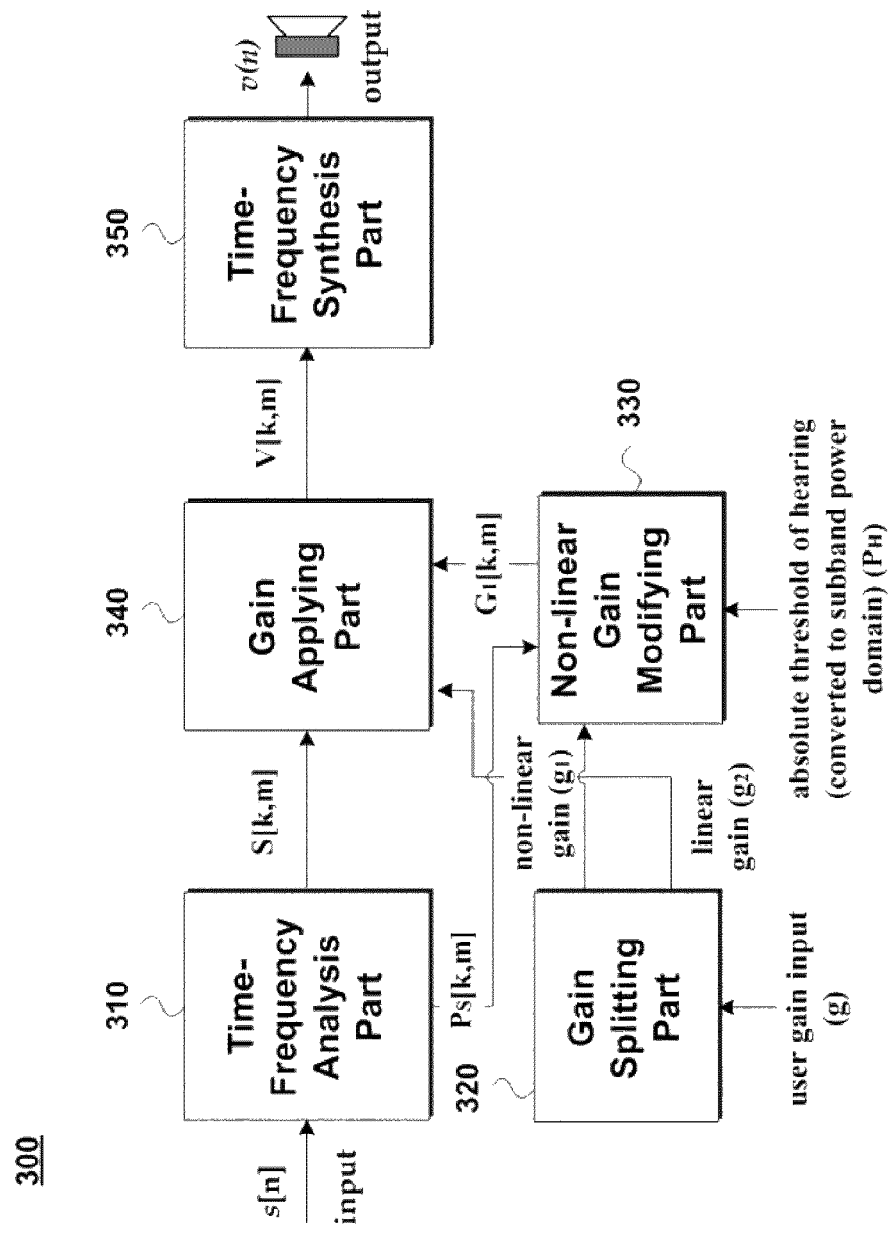
FIG. 2 is a block diagram for details of a volume control unit according to an embodiment of the present invention.

FIG. 2 is a block diagram for details of the volume controlling unit shown in FIG. 1.

Referring to FIG. 2, the volume controlling unit 300 includes a gain splitting part 320, non-linear gain modifying part 330 and a gain applying part 340 and is able to further include a time-frequency analysis part 310 and a time-frequency synthesis part 350.

An input signal, an output signal and a gain of the volume controlling unit 300 have the following relation shown in Formula 1.

$$V[n]=gs[n] \qquad \text{[Formula 1]}$$

In Formula 1, the v(n) indicates an output signal, the g indicates a gain, the s(n) indicates an input signal, the g indicates a specific gain (or a user gain input), and the n indicates a time index.

For simplification, assume that the gain g in Formula 1 is a maximum volume if g=1 or a minimum volume (i.e., a zero volume) if g=0.

If the user gain (g) is a constant (i.e., a linear gain) instead of a function per frequency band or the gain g is a small level value, a level of a signal can be lowered equal to or smaller than an absolute hearing threshold for a low or high frequency band. This is because the absolute hearing threshold of the low or high frequency band is relatively greater than that of a middle band. If the level of the signal is decreased equal to or lower than the absolute hearing threshold, a listener may not be able to just hear the sound on the corresponding frequency band at all. And, the relevant details shall be described again later.

Therefore, the user gain g is not set to a constant but is split into a non-linear gain $g_1$ and a linear gain $g_2$. And, the relevant details shall be explained with reference to the description of the gain splitting part 320 later.

The time-frequency analysis part 310 generates a signal in time-frequency domain or a plurality of subband signals S[k, m] by performing time-frequency conversion on the input signal s(n) in the time domain. In this case, the time-frequency conversion can be performed by SFT (short-time Fourier transform), by which the present invention is non-limited.

The gain splitting part 320 does not set the user input gain g to a constant but splits the user gain input g into two factors (e.g., a non-linear gain $g_1$ and a linear gain $g_2$) occasionally. The relevant definition is represented as Formula 2.

$$g=g_1 g_2 \qquad \text{[Formula 2]}$$

In Formula 2, the g indicates a user gain input, the $g_1$ is a non-linear gain, and the $g_2$ is a linear gain.

Meanwhile, the non-linear gain $g_1$ is a factor determined based on an absolute hearing threshold $P_H$. In determining the non-linear gain $g_1$ and the linear gain $g_2$, it is able to use a high reference value and a low reference value. Details of a method of calculating a non-linear gain and a linear gain shall be described together with embodiments of the gain splitting unit 300 later.

The non-linear gain modifying part 330 generates a modified non-linear gain $G_1[k, m]$ by modifying the non-linear gain $g_1$ using the absolute hearing threshold $P_H[m]$ and power of input signal Ps[k, m]. In doing so, Formula 3 is usable.

$$G_1[k, m] = \sqrt{\frac{g_1^2 \max(P_s[k, m] - P_H[m], 0) + P_H[m]}{P_S[k, m]}} \quad \text{[Formula 3]}$$

In Formula 3, the $G_1[k, m]$ indicates a modified non-linear gain, the $P_H[m]$ indicates an absolute hearing threshold in a subband power domain, the $g_1$ indicates a non-linear gain, the $Ps[k, m]$ indicates a subband power of an input signal, the k indicates a time index, and the m indicates a frequency index.

The modified non-linear gain can be value invariant per frequency band. The power of the input signal $Ps[k, m]$ may be estimated by the time-frequency analysis part 310) based on input signal $s[n]$, which does not put limitations on the present invention.

Figure 3:
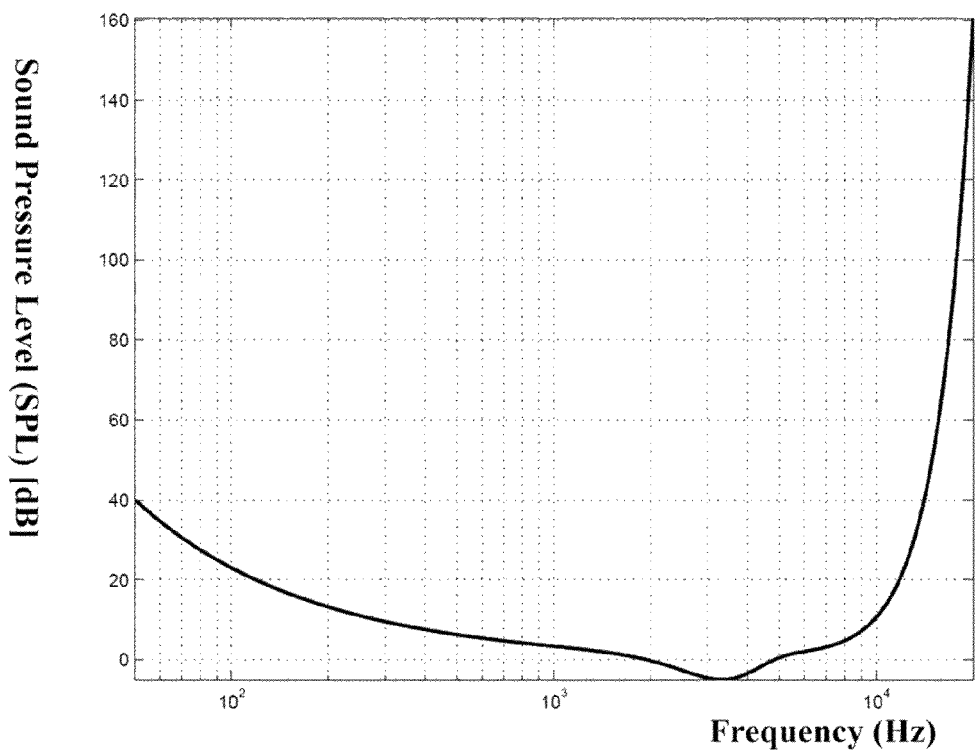
FIG. 3 is a graph for an example of an absolute threshold of hearing.
Figure 4:
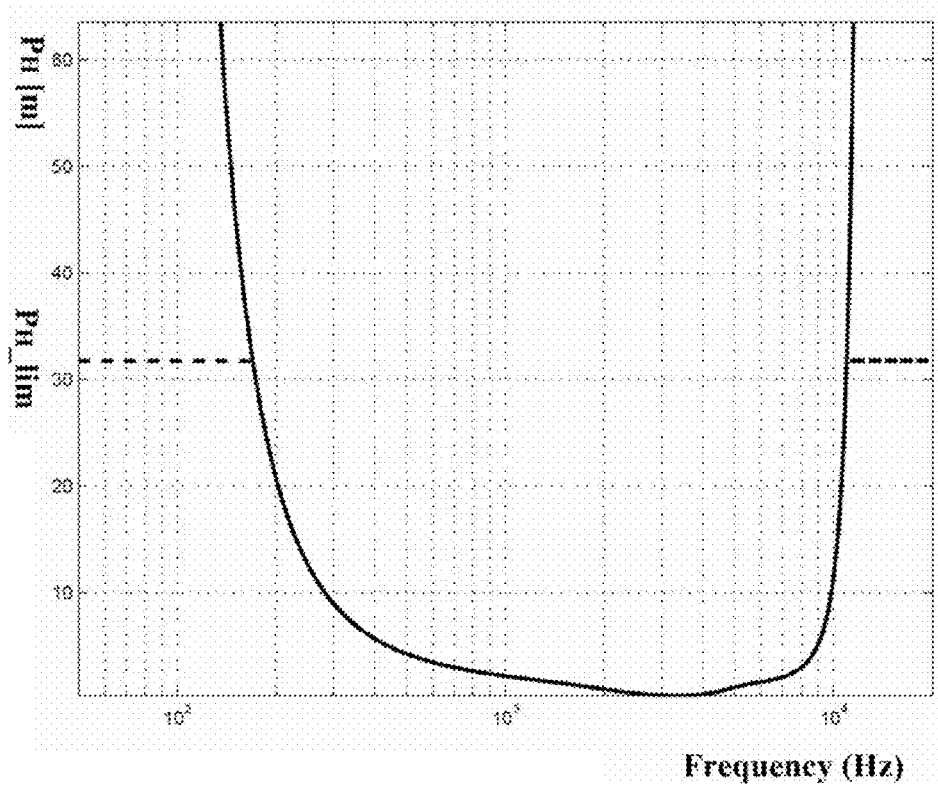
FIG. 4 is a graph for an example of an absolute threshold of hearing in subband power domain.

Meanwhile, FIG. 3 shows the example of the absolute hearing threshold, while FIG. 4 shows the example of the absolute hearing threshold in the subband power domain. Particularly, FIG. 3 shows one example of the absolute hearing threshold according to each sound pressure level (SPL) [dB] per frequency. In this case, the sound pressure level is a pressure of sound by logarithm unit with reference to a specific pressure (e.g., 20 micro Pascal) and its unit is decibel. Occasionally, sound can be represented as sound intensity. Besides, a hearing sense actually perceived by a human for each sound pressure level is called sound loudness (unit: phon). And, an absolute hearing threshold indicates a minimum sound pressure level (SPL) that can be heard on each frequency. The minimum sound pressure level can correspond to a case that loudness is 3 phons. And, FIG. 3 shows one example of the absolute hearing threshold. Referring to FIG. 3, it can be observed that a sound pressure level corresponding to a hearing threshold is relatively high on a high frequency band (e.g., over $10^4$ Hz) or a low frequency band (e.g., $0 \sim 10^2$ Hz). Hence, as mentioned in the foregoing description, when a volume is linearly adjusted, if the volume is adjusted into a low level, the intensity of the signal may fall into a level equal to or smaller than an audible frequency. In particular, if the volume is linearly adjusted into a low level, it may cause a problem that a human is unable to hear a signal on a high or low frequency band. The present invention intends to control a volume of a signal using a gain adaptive per frequency band.

Meanwhile, the absolute hearing threshold is a value resulting from averaging values of sound pressure levels of minimum loudness perceptible by a plurality of humans having different auditory structures. In particular, since the absolute hearing threshold varies according to what kind of auditory structure is provided to a listener, the absolute hearing threshold may not be suitable according to who is the listener. Further, if a location of an absolute-hearing listener is well provided, a loudness model can have high precision. Therefore, if a location of a listener changes, an audio apparatus is not able to obtain the information on the change of the location.

Yet, the absolute hearing threshold represented as the sound pressure level per frequency band can be transformed into a subband power domain (or a power spectral domain). In case that the absolute hearing threshold is transformed into the subband power domain, a specific electric to acoustic power transfer function and approximate estimation of listening position can be explicitly or implicitly taken into consideration. In particular, when the absolute hearing threshold is transformed into a power domain from dB, if it is additionally scaled, a power spectral value approximately corresponds to a sound pressure level. One example of an absolute hearing threshold $P_H[m]$ transformed into a subband power domain is shown in FIG. 4. Since this algorithm puts limitation on a size of the absolute hearing threshold, it is advantageous in that the threshold is prevented from being exceeded on a very low or high frequency. If this limit value $P_{H\_}$lim m is set higher than a minimum value of the absolute hearing threshold $P_H[m]$ by 20 dB at least, it can be represented as a dotted line part shown in FIG. 4.

Referring now to Formula 3, the $g_1$ is the formerly defined non-linear gain. And, a max function is provided to prevent a subband power value of the input signal from becoming smaller than a value of the absolute hearing threshold (i.e., '$P_S[k, m]-P_H[m]$' is prevented from becoming negative). If the non-linear gain $g_1$ is set to 0, $G_1[k, m]$ becomes a value that is not 1. If the non-linear gain $g_1$ is set to 1, the $G_1[k, m]$ becomes 1.

Referring now to FIG. 2, the gain applying part 340 applies the modified non-linear gain $G_1[k, m]$ generated by the non-linear gain modifying part 330 and the linear gain $g_2$ generated by the gain splitting part 320 to the input signal (i.e., a plurality of subband signals) $S[k, m]$. This can be defined as Formula 4.

$$V[k,m]=g_2 G_1[k,m]S[k,m] \quad \text{[Formula 4]}$$

In Formula 4, the $V[k, m]$ indicates a per-subband output signal, the $g_2$ indicates a linear gain, the $G_1[k, m]$ indicates a modified non-linear gain, and the $S[k, m]$ indicates a per-subband input signal.

In this case, the $g_2$ indicates a linear gain not varying per frequency band and the $G_1[k, m]$ indicates a non-linear gain generated on the basis of an absolute hearing threshold as a frequency function.

The time-frequency synthesis part 350 generates an output signal $v(n)$ in time domain by performing frequency inverse transform on the per-subband output signal. In this case, the output signal $v(n)$ may be equal to the former output signal in Formula 1.

In the following description, two embodiments of a process for generating a non-linear gain and a linear gain are explained in detail with reference to FIGS. 5 to 10.

Figure 5:
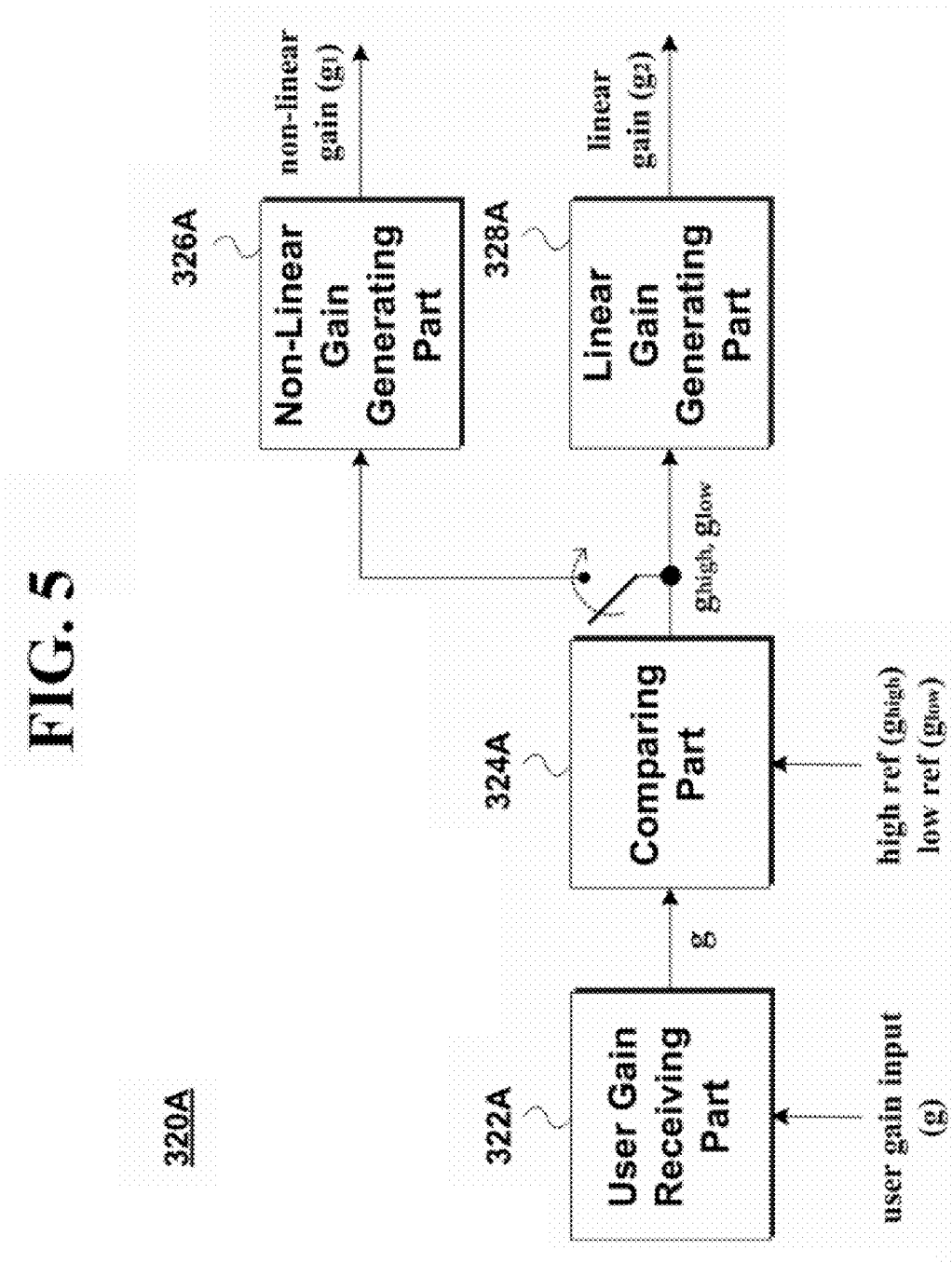
FIG. 5 is a detailed block diagram of a gain splitting unit shown in FIG. 2 according to a first embodiment of the present invention.
Figure 6:
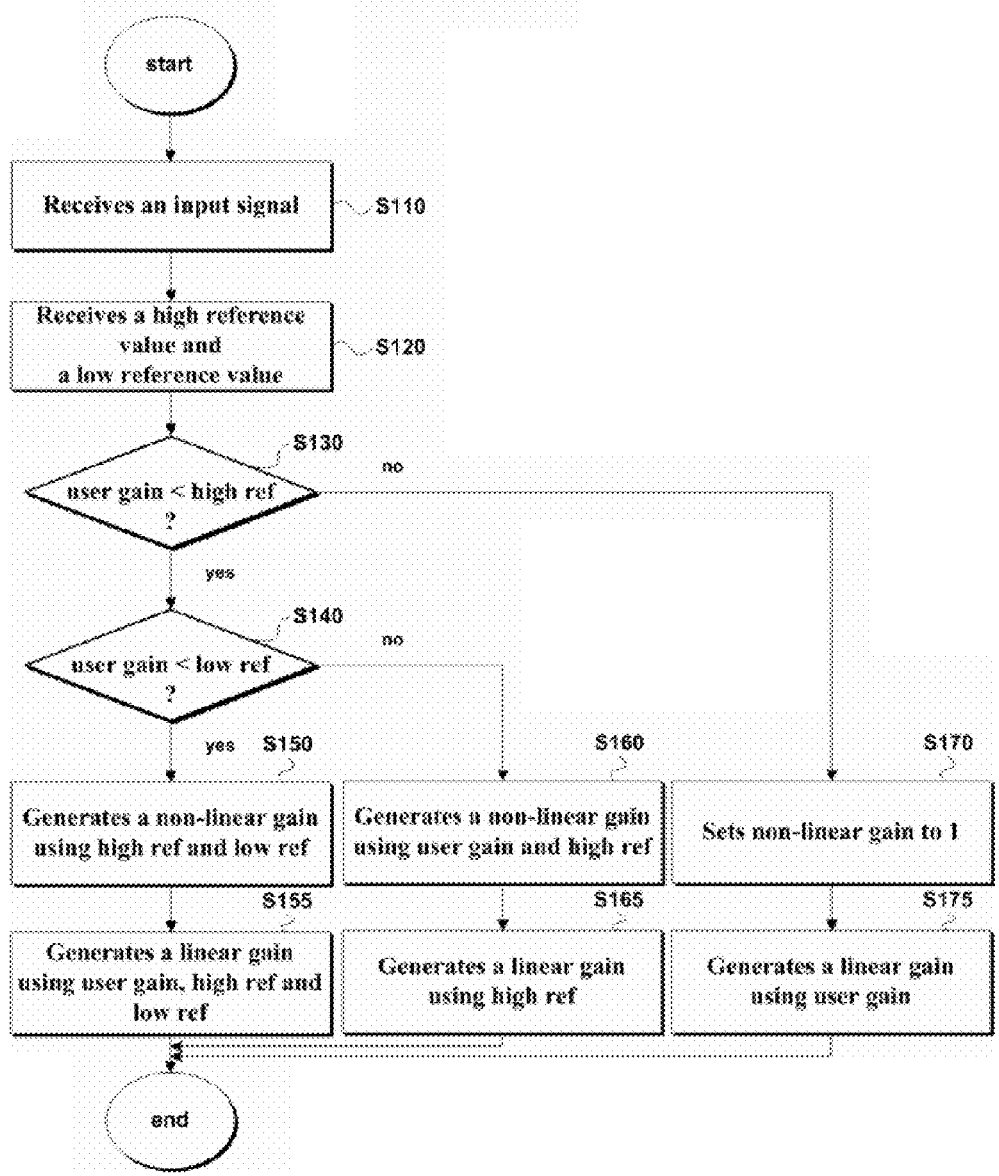
FIG. 6 is a flowchart for a gain generating method according to the first embodiment shown in FIG. 5.

FIG. 5 is a detailed block diagram of a gain splitting unit shown in FIG. 2 according to a first embodiment of the present invention, and FIG. 6 is a flowchart for a gain generating method according to the first embodiment shown in FIG. 5. Although the gain splitting unit 320 shown in FIG. 2 can include the detailed configuration shown in FIG. 5, it can include other components as well.

Referring to FIG. 5, the gain splitting unit 320 includes a comparing part 324A, a non-linear gain generating part 326A and a linear gain generating part 328A and is able to further include a user gain receiving part 322A. In the following description, a first embodiment 320A of the gain splitting unit is explained with reference to FIG. 5 and FIG. 6 together.

First of all, the user gain receiving part 322A receives a user gain input (g) from a user interface, a memory or the like [S110]. In this case, as mentioned in the foregoing description of FIG. 1 and FIG. 2, the user gain input (g) can include data inputted by a user to adjust a size of an input signal or a value stored as a default value in a memory or the like.

The comparing unit 324A receives a user gain g, a high reference value $g_{high}$ and a low reference value $g_{low}$ [S120]. The comparing unit 324A determines whether the user gain g is greater than the high reference value $g_{high}$ and further determines whether the user gain g is greater than the low reference value $g_{low}$ [S130 and S140]. In this case, a linear volume control is simply performed at the high reference value $g_{high}$ or over an upper volume limit. Therefore, if the high reference value is determined as a high level, it is able to perform a non-linear gain control on the basis of an absolute hearing threshold at a high volume level. Meanwhile, the linear volume control is dominantly performed at the low reference value $g_{low}$ or below an lower volume limit. Therefore, once the low reference value $g_{low}$ is set to 0, it is able to perform the non-linear control up to the interval of which level becomes zero. In an interval between the high reference value and the low reference value, the non-linear control on the basis of the absolute hearing threshold is dominantly performed. The relevant relation shall be explained in detail later.

If the user gain g is equal to or greater than the high reference value $g_{high}$ ['No' in the step S130], the comparing part 324A delivers the user gain g to the linear gain generating part 328A only. If the user gain g is equal to or greater than the high reference value $g_{high}$ ['No' in the step S130], the comparing part 324A delivers at least one of the high reference value $g_{high}$ and the low reference value $g_{low}$ to each of the non-linear gain generating part 326A and the linear gain generating part 328A as well as the user gain g.

Figure 7:
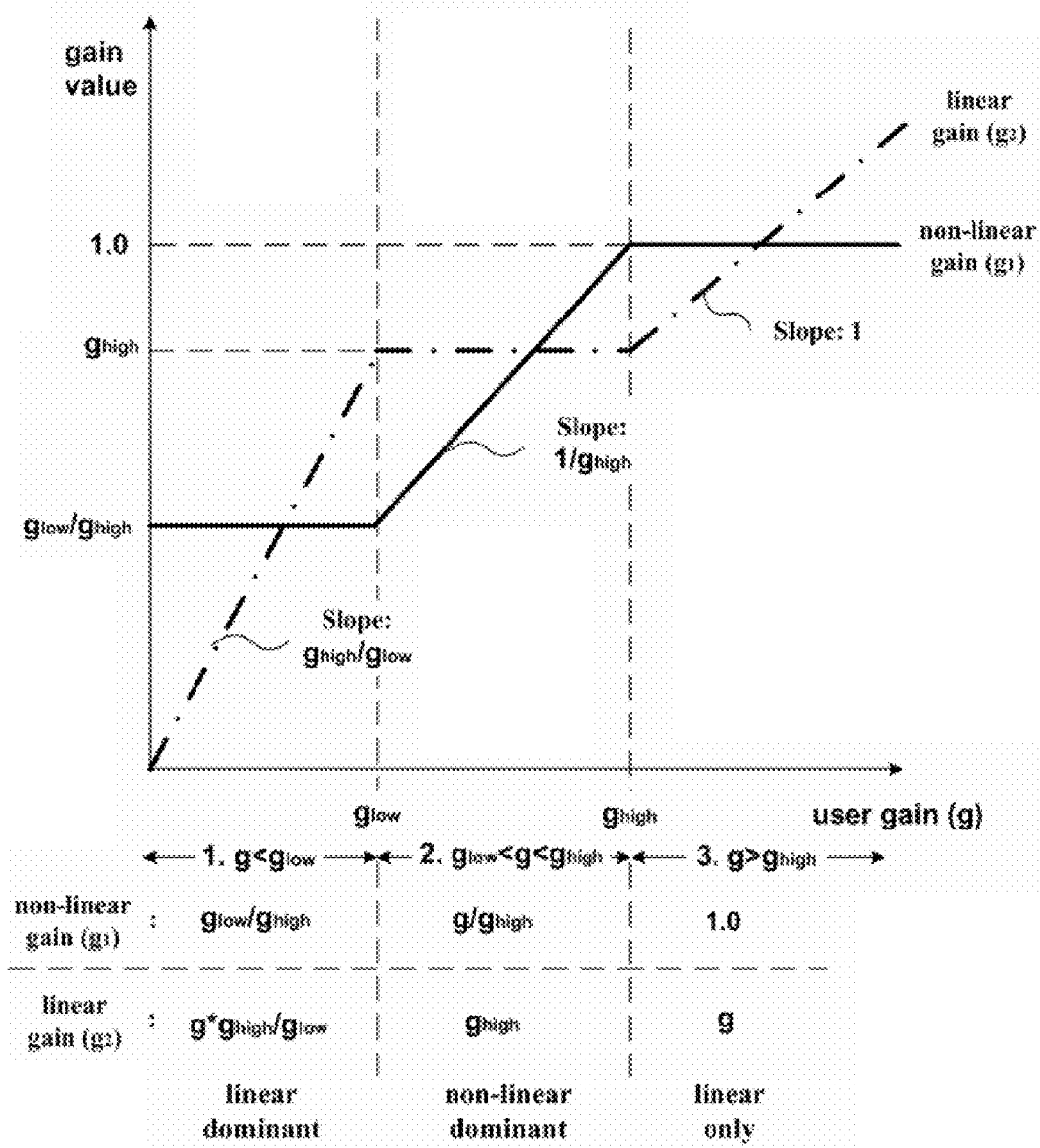
FIG. 7 is a diagram for per-interval variations of linear and non-linear gains generated by the gain splitting unit shown in FIG. 6.

FIG. 7 shows one example for a case that a non-linear gain $g_1$ and a linear gain $g_2$ is determined according to whether a user gain g is greater than or smaller than a high reference value $g_{high}$ (and a low reference value $g_{low}$). The following description is made with reference to FIG. 6 and FIG. 7.

As mentioned in the foregoing description, if the user gain g is equal to or greater than the high reference value $g_{high}$ ['No' in the step S130] ['Interval 3' in FIG. 7], the comparing part 324A delivers the user gain g to the linear gain generating part 328A only. Hence, the non-linear gain generating part 326A sets the non-linear gain $g_1$ to 1 [S170], while the linear gain generating part 328A sets the linear gain $g_2$ equal to the user gain g ($g_2$=g) [S175].

On the contrary, if the user gain g is smaller than the high reference value $g_{high}$ and is also equal to or greater than the low reference value $g_{low}$ ['No' in the step S140] ['Interval 2' in FIG. 7], the non-linear gain generating part 326A generates the non-linear gain $g_1$ using the user gain and the high reference value $g_{high}$ [S160], while the linear gain generating part 328A generates the linear gain $g_2$ using the high reference value $g_{high}$ [S165].

Besides, if the user gain g is smaller than the low reference value $g_{low}$ ['yes' in the step S140] ['interval 1' in FIG. 7], the non-linear gain generating part 326A generates the non-linear gain $g_1$ using the high reference value $g_{high}$ and the low reference value $g_{low}$ [S150], while the linear gain generating part 328A generates the linear gain $g_2$ using the user gain g, the high reference value $g_{high}$ and the low reference value $g_{low}$ [S155].

One example of generating the non-linear gain and the linear gain is represented as Formula 5.

If $g > g_{high}$, $g_1 = 1.0$, $g_2 = g$ [Formula 5]

If $g_{low} < g < g_{high}$, $g_1 = g/g_{high}$, $g_2 = g_{high}$

If $g < g_{low}$, $g_1 = g_{low}/g_{high}$, $g_2 = g \cdot g_{high}/g_{low}$

In Formula 5, the g indicates a user gain input, the $g_{high}$ indicates a high reference value, the $g_{low}$ indicates a low reference value, the $g_1$ indicates a non-linear gain, and the $g_2$ indicates a linear gain.

Meanwhile, FIG. 7 is a diagram for per-interval variations of linear and non-linear gains. In a first case ('interval 3' in FIG. 7) of Formula 5, a non-linear gain is set to 1 and a user gain is handled as a linear gain. Hence, a volume control is linearly performed in this interval. In a second case ('interval 2' in FIG. 7) of Formula 5, a non-linear gain increases according to a size of a user gain g, whereas a linear gain is set to a constant (e.g., $g_{high}$). Hence, it can be observed that a non-linear volume control is dominant in this interval. In a third case ('interval 1' in FIG. 7) of Formula 5, a non-linear gain is set to a constant (e.g., $g_{low}/g_{high}$) and a user gain is able to increase according to a size of a user gain g. Hence, like the interval 3, it can be observed that a linear volume control is dominant in this interval.

The non-linear gain factor $g_1$ and the linear gain factor $g_2$ are generated based on whether the user gain input is lower or higher than at least one of a low reference value and a high reference value. In particular, when the user gain input is lower than a low reference value (in a third case ('interval 1' in FIG. 7) of Formula 5), the non-linear gain factor is generated as a fixed value, and the linear gain factor is generated using the user gain input. When the user gain input is equal to or higher than a low reference value (in a second case ('interval 2' in FIG. 7) of Formula 5), the non-linear gain factor is generated using the user gain input and the linear gain factor is generated as a fixed value. The fixed value is determined according to the low reference value and a high reference value. When the user gain input is equal or higher than a high reference value (in a first case ('interval 3' in FIG. 7) of Formula 5), the non-linear gain factor may be equal to one and the linear gain factor may be equal to the user gain input.

As mentioned in the foregoing description regarding the absolute hearing threshold, in case of adjustment into a high level, since the level to adjust is remote from the absolute hearing threshold, the adjustment is linearly controlled. On the contrary, in case of adjustment into a low level, since a user-specific level can have a value similar to the absolute hearing threshold, both linear and non-linear factors are adjusted. Therefore, it is able to prevent a specific frequency band from decreasing below the absolute hearing threshold only.

So far, the first embodiment of the gain splitting unit is described with reference to FIGS. 5 to 7. In the following description, a second embodiment 320B of the gain splitting unit is explained with reference to FIGS. 8 to 10.

Figure 8:
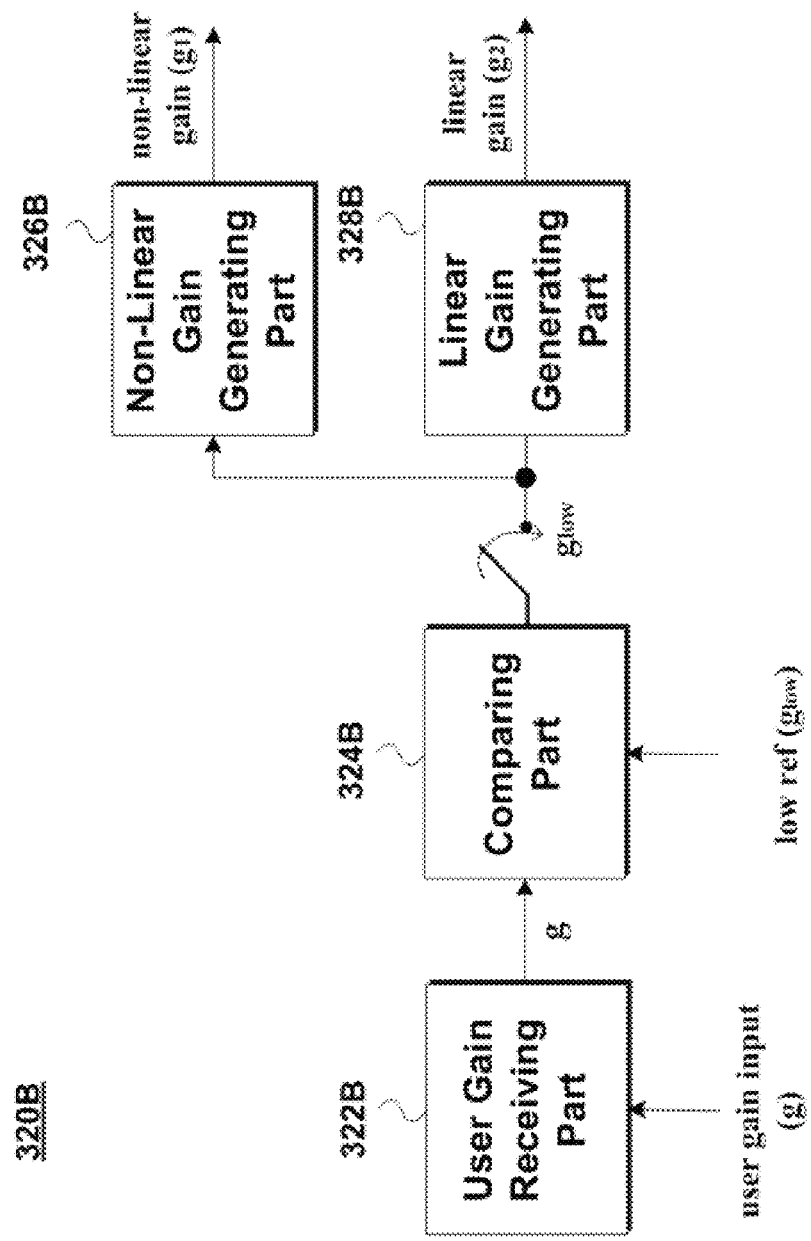
FIG. 8 is a detailed block diagram of a gain splitting unit shown in FIG. 2 according to a second embodiment of the present invention.
Figure 9:
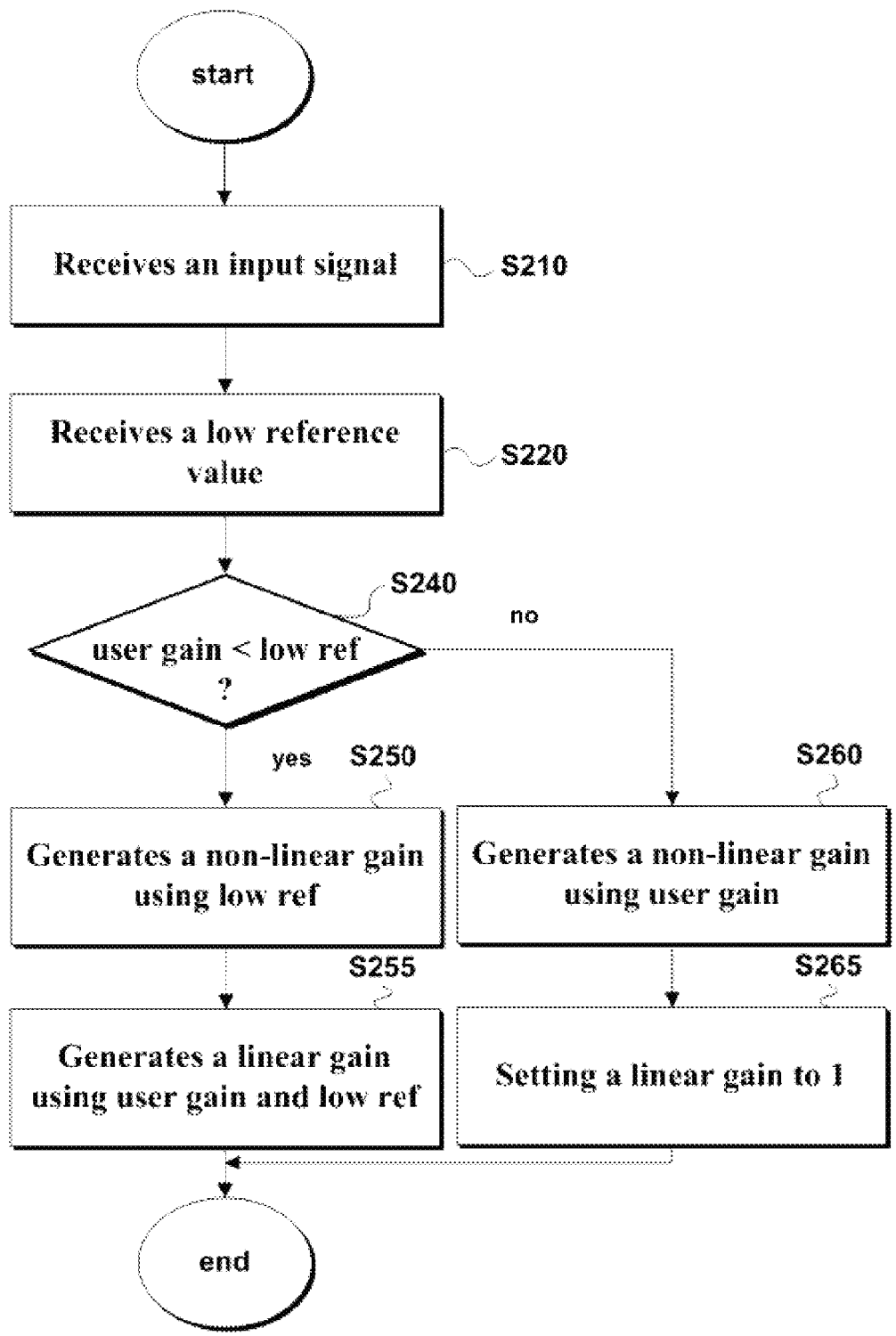
FIG. 9 is a flowchart for a gain generating method according to the second embodiment shown in FIG. 8.

FIG. 8 is a detailed block diagram of a gain splitting unit shown in FIG. 2 according to a second embodiment of the present invention, and FIG. 9 is a flowchart for a gain generating method according to the second embodiment shown in FIG. 8. Unlike the first embodiment of the present invention, a second embodiment of the present invention relates to a case that a non-linear gain control is performed in case of a user gain g greater than a low reference value $g_{low}$ not based on whether the user gain g is higher than a high gain value $g_{high}$. According to the second embodiment of the present invention, since it may be difficult to output a high level due to a speaker output capability limit in case of a high level value, a volume is non-linearly controlled with reference to an extent of human-perceptible loudness rather than controlling a volume linearly.

Referring to FIG. 8, a second embodiment 320B of a gain splitting unit includes a comparing part 324B, a non-linear gain generating part 326B and a linear gain generating part 328B and is able to further include a user gain receiving part 322B.

First of all, the user gain receiving part 322B receives a user gain input g like the former component of the same name in the first embodiment [S210].

Likewise, the comparing part 32B receives a user gain g and a low reference value $g_{low}$ [S220] and then determines whether the user gain g is greater than the low reference value $g_{low}$ [S240]. If the user gain g is smaller than the low reference value $g_{low}$, the comparing part 324B delivers the low reference value $g_{low}$ to the non-linear gain generating part 326B and also delivers the user gain g and the low reference value $g_{low}$ to the linear gain generating part 328B. If the user gain g is greater than the low reference value $g_{low}$, the comparing part 324B delivers the user gain g to the non-linear gain generating part 326B only.

A method of generating a non-linear gain and a linear gain per interval is explained with reference to FIG. 9 and FIG. 10 as follows.

Figure 10:
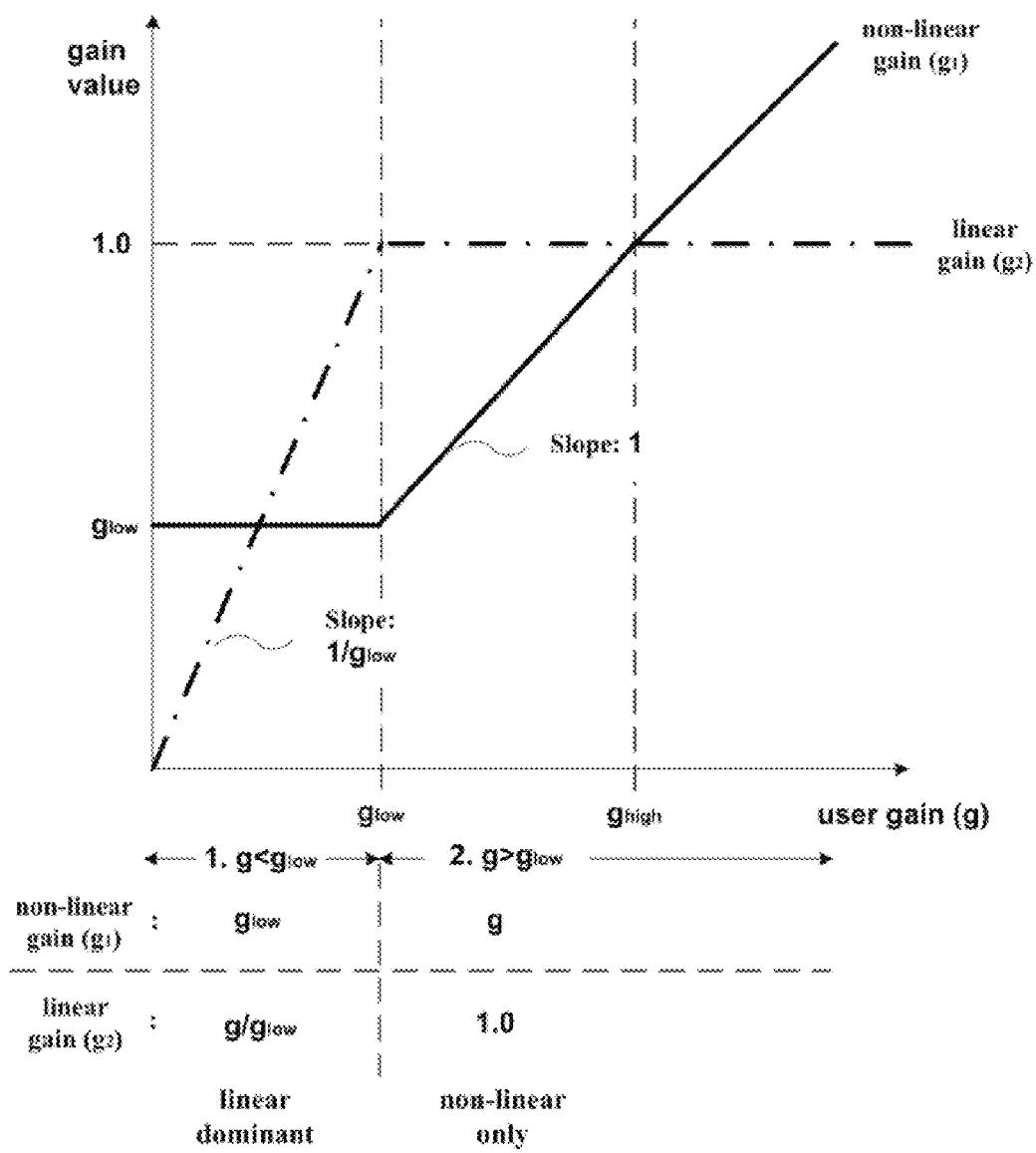
FIG. 10 is a diagram for per-interval variations of linear and non-linear gains generated by the gain splitting unit shown in FIG. 8.

Referring to FIG. 9 and FIG. 10, if the user gain g is equal to or greater than the low reference value $g_{low}$ ['No' in the step S240 in FIG. 9] ['Interval 2' in FIG. 10], the non-linear gain $g_1$ is set equal to the user gain g [S260] and the linear gain $g_2$ is set to 0 [S265].

On the contrary, if the user gain g is smaller than the low reference value $g_{low}$ ['Yes' in the step S240 shown in FIG. 9] ['Interval 1' in FIG. 10], the non-linear gain the non-linear gain $g_1$ is generated using the low reference value $g_{low}$ [S250] and the linear gain $g_2$ is generated using the user gain g and the low reference value $g_{low}$ [S225].

One example of generating the non-linear gain and the linear gain according to the second embodiment is represented as Formula 5.

If $g > g_{low}$, $g_1 = g$, $g_2 = 1.0$          [Formula 6]

If $g < g_{low}$, $g_1 = g_{low}$, $g_2 = g/g_{low}$

In Formula 6, the g indicates a user gain input, the $g_{low}$ indicates a low reference value, the $g_1$ indicates a non-linear gain, and the $g_2$ indicates a linear gain.

FIG. 10 is a diagram for per-interval variations of linear and non-linear gains according to the second embodiment.

In a first case of Formula 6 ('interval 2' in FIG. 10), a user gain is a non-linear gain and a linear gain is set to 1. Hence, a volume control is non-linearly performed in this interval. In a second case of Formula 6 ('interval 1' in FIG. 10), a non-linear gain is a constant (e.g., $g_{low}$) and a linear gain is able to increase according to a size of a user gain g. Hence, it can be observed that a linear control is relatively dominant in this interval.

The non-linear gain factor $g_1$ and the linear gain factor $g_2$ are generated based on whether the user gain input is lower or higher than at least one of a low reference value. In particular, when the user gain input is lower than a low reference value (in a second case ('interval 1' in FIG. 7) of Formula 6), the non-linear gain factor $g_1$ is generated as a fixed value, and the linear gain factor $g_2$ is generated using the user gain input. When the user gain input is equal to or higher than a low reference value (in a first case ('interval 2' in FIG. 7) of Formula 6), the non-linear gain factor is generated using the user gain input and the linear gain factor is generated as a fixed value. The fixed value is determined according to the low reference value. When the user gain input is equal or higher than a low reference value (in a first case ('interval 2' in FIG. 7) of Formula 6), the non-linear gain factor may be equal to the user gain input and the linear gain factor may be equal to one.

As mentioned in the foregoing description, if it is unable to output a signal at a high level due to a relatively low output of a speaker, a signal level outputtable from the speaker is limited despite that a user-specific volume is high. Therefore, it is able to perform a non-linear volume control based on an absolute hearing threshold.

Thus, the non-linear gain $g_1$ generated by the gain splitting part 320 according to the first or second embodiment is input-ted to the gain applying part 240 shown in FIG. 2 and is then applied to an input signal (or subband signals for the input signal).

Stereo Channel and Multi-Channel

The aforesaid volume control method is applicable to a stereo signal and multi-channel.

According to a first method, the volume control method is applied to each audio channel (e.g., left channel, right channel, center channel, left surround channel, etc.), whereby linear and non-linear gains for each of the channels are generated.

According to a second method, using a sum of subband powers $P_S[k, m]$ for whole channels, a common gain $G_1[k, m]$ applied to a stereo signal or a multi-channel is generated (As $g_2$ is signal-independent, it is equal to every channel). In calculating the $G_1[k, m]$ according to Formula 3, the $P_S[k, m]$ can insert a total of a sum corresponding to all audio channels.

Figure 11:
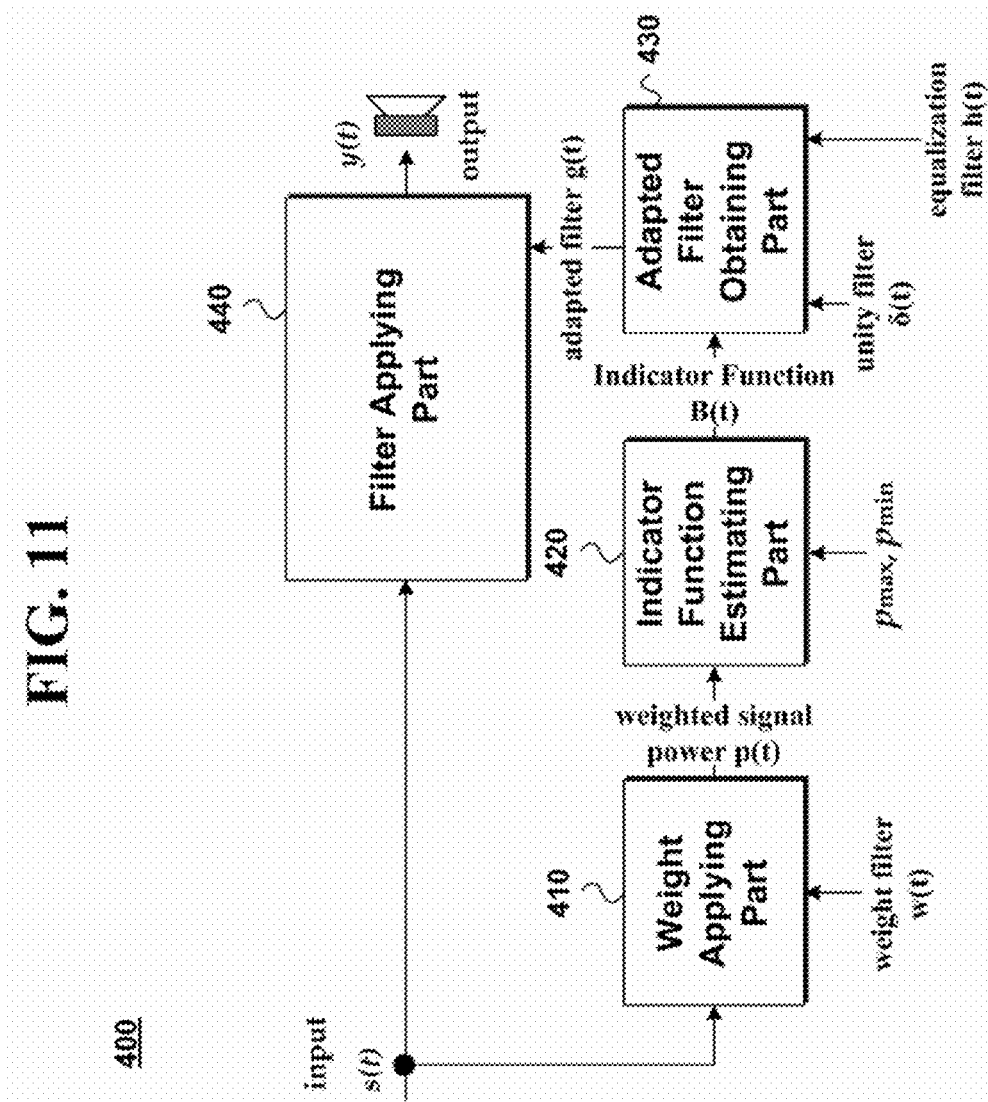
FIG. 11 is a detailed block diagram for an embodiment of a bass control unit according to an embodiment of the present invention.
Figure 12:
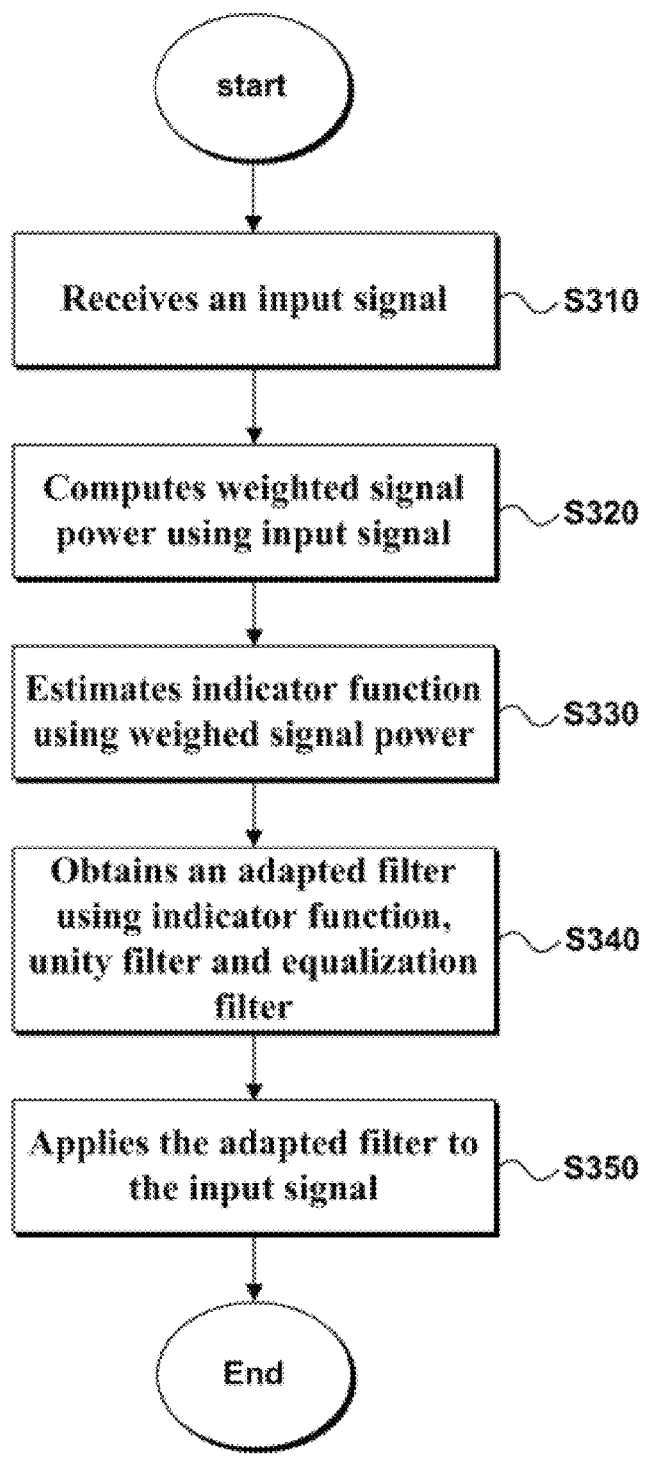
FIG. 12 is a flowchart of a method of controlling bass according to an embodiment of the present invention.

FIG. 11 is a detailed block diagram for an embodiment of a bass controlling unit according to an embodiment of the present invention, and FIG. 12 is a flowchart of a method of controlling bass according to an embodiment of the present invention.

Referring to FIG. 11, a bass controlling unit 400 according to an embodiment of the present invention includes an indicator function estimating part 420 and a filter obtaining part 430 and is able to further include a weight applying part 410 and a filter applying part 440.

If a frequency is f(Hz), a loudspeaker has a frequency response of M(f). The frequency response M(f) indicates a real number for determining a relative strength indicating which sound is actually emitted via the loudspeaker per frequency band.

A filter h(t), which is an inverse number (i.e., 1/M(f)) of the frequency response M(f), is applied to a signal before being outputted via the loudspeaker. Ideally, a frequency response of an acoustically emitted sound is flat.

Meanwhile, in case of a small frequency response value, large amplification is necessary for the corresponding frequency. Moreover, since distortion tends to be caused at a low level due to an excessively amplified low-frequency signal, a les volume-filtered signal can be introduced into a loudspeaker only.

Figure 13:
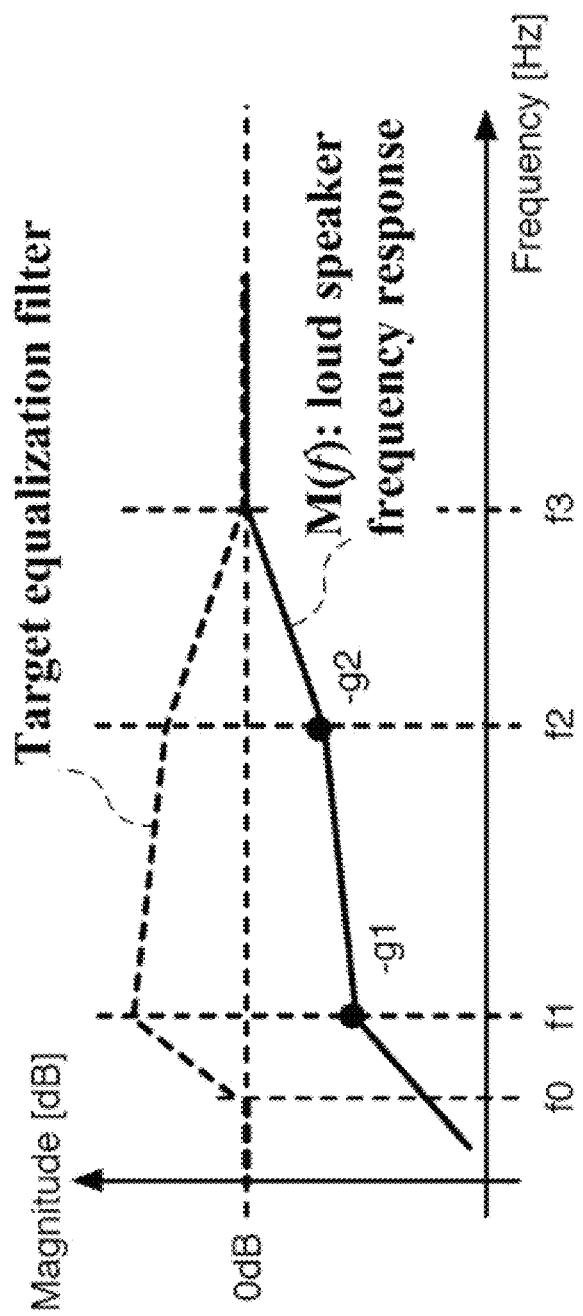
FIG. 13 is a graph for examples of a loudspeaker response and a target equalization filter.

FIG. 13 is a graph for examples of a loudspeaker response and a target equalization filter.

Referring to FIG. 13, one example of a frequency response M(f) of a loudspeaker is represented as a solid line. The frequency response of the loudspeaker starts to fall below a specific frequency f3, smoothly decreases between frequencies f2 and f3, and then falls again below f1 abruptly. To the loudspeaker having a poor frequency response of a low frequency, a considerable gain for a low frequency signal should be given. FIG. 13 conceptionally shows a target equalization filter, i.e., an inverse filter of the frequency response M(f). In an interval between frequencies f1 and f2, for which an inverse filter for a frequency response is suitable, the frequency response is inverted. Yet, in an interval of which frequency is below f1, h(t) for the frequency response is limited to a case that a frequency is f1 or the h(t) decreases. If the filter h(t) for the frequency response is used, it is able to enhance the low frequency response of the loudspeaker. Yet, since low frequency energy is considerably boosted in a signal, if a volume increases higher, the loudspeaker can be distorted at a considerably low sound level without equalization.

If the filter applied to the loudspeaker is adapted according to time, the bass can be extended as many as possible in a manner of avoiding overdriving the loudspeaker.

A process for generating the filter is explained in detail with reference to FIG. 11 and FIG. 12 as follows.

First of all, a receiving part (not shown in the drawings) receives an input signal [S310].

A weight applying part 410 calculates a power of a weighted signal using an input signal s(t) and a weight filter w(t) [S320]. In this case, a signal power can be calculated according to the following formula. In this case, although the input signal s(t) may correspond to the volume controlled signal v(n) shown in FIG. 1, it may include an input signal y[n], a noise controlled signal or a normalized signal s(n).

$$P(t)=E\{(w(t)*s(t))^2\} \quad \text{[Formula 7]}$$

In Formula 7, the P(t) indicates a signal power, the w(t) indicates a weight signal, the s(t) indicates an input signal, and the E{ } indicates a short-time average operator.

In this case, a single-pole average having a time constant of 200 ms is usable, by which the present invention is non-limited.

An indicator function estimating part 420 generates an indicator function B(t) using the formerly generated signal power p(t) [S330]. Using the signal power, the indicator function is generated in consideration of a headroom (i.e., a difference between a distortion generated peak and a dynamic range of a corresponding signal) for a loudspeaker. In this case, the indicator function B(t) can be generated by the following formula.

$$B(t) = \min\left(\frac{\max(p(t)-p_{min}, 0)}{p_{max}-p_{min}}, 1.0\right) \quad \text{[Formula 8]}$$

In Formula 8, the B(t) indicates an indicator function, the Pmax indicates a maximum power, and the Pmin indicates a minimum power.

Figure 14:
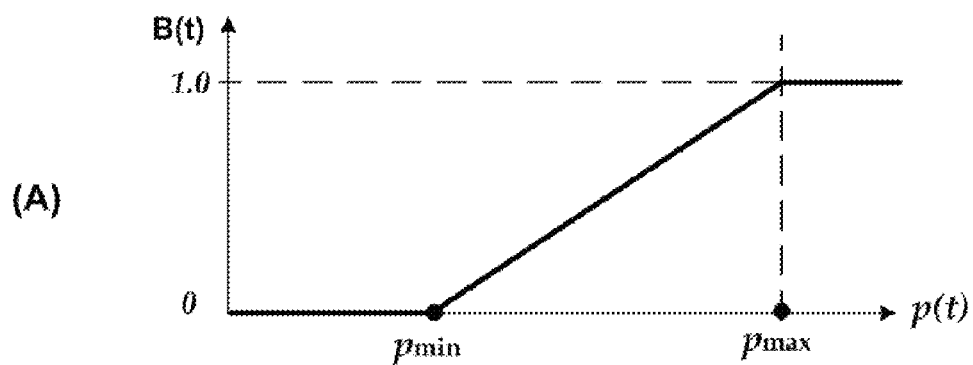
FIG. 14 is a graph for an indicator function and a variation of an adaptive filter according to a signal power.

FIG. 14 is a graph for an indicator function and a variation of an adaptive filter according to a signal power p(t).

Referring to (A) of FIG. 14, if a signal power p(t) is smaller than a minimum power Pmin, an indicator function B(t) is 0. As the signal power p(t) increases, the indicator function B(t) gradually increases. If the signal power p(t) becomes a maximum power Pmax, the indicator function B(t) converges into 1.0.

A filter obtaining part 430 generates an adaptive filter using the indicator function B(t), a unity filter and an equalization filter [S340]. In doing so, Formula 9 is usable.

$$g(t)=B(t)\delta(t)+(1-B(t))h(t) \quad \text{[Formula 9]}$$

In Formula 9, the g(t) indicates an adaptive filter, the B(t) indicates an indicator function, the δ(t) indicates a unity filter (e.g., a delta Dirac function), and the h(t) indicates an equalization filter.

Referring to (B) of FIG. 14, a value of the adaptive filter g(t) according to the signal power p(t) and the indicator function B(t) is shown. If the signal power p(t) is equal to or smaller than a minimum power, the adaptive filter g(t) directly becomes the equalization filter h(t). If the signal power p(t) is equal to or greater than a maximum power, the adaptive filter g(t) becomes the unity filter δ(t). In a region in-between (i.e., if smaller than the maximum power and greater than the minimum power), the adaptive filter has a configuration in which both of the equalization filter and the unity filter coexist.

Figure 15:
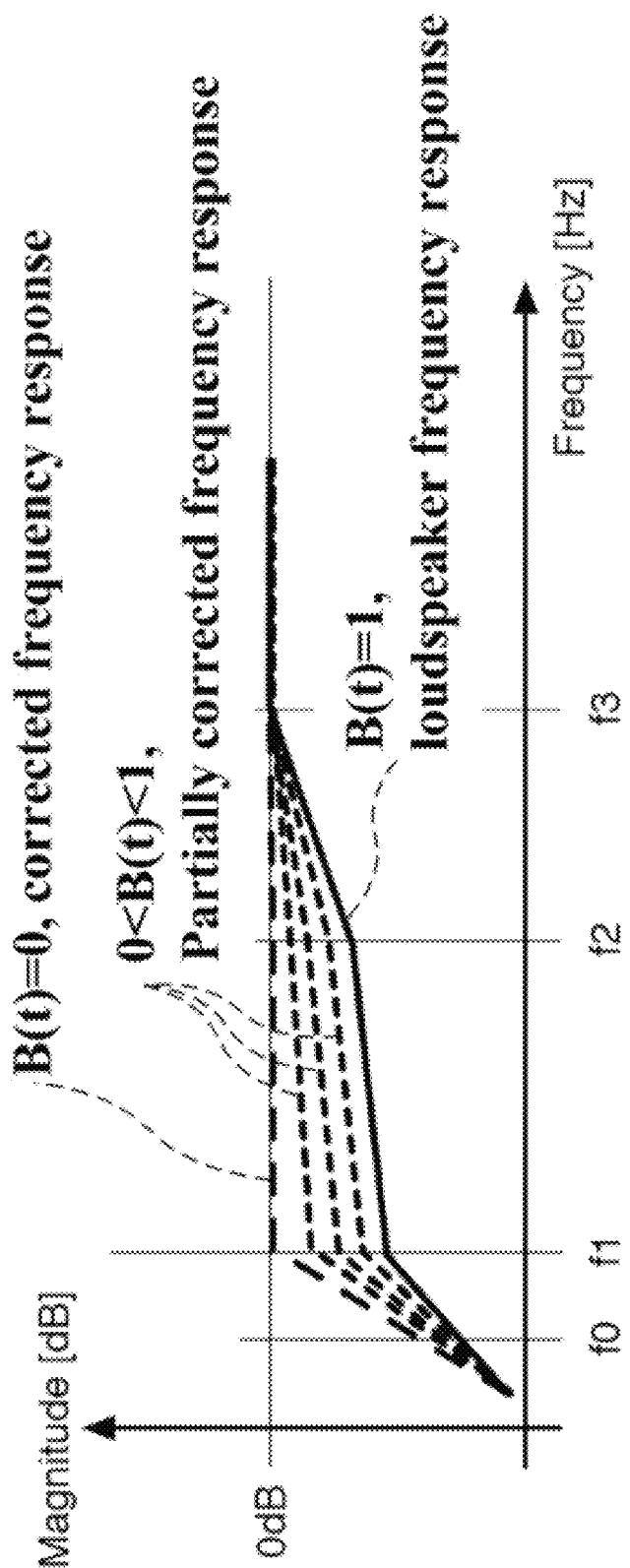
FIG. 15 is a graph for a loudspeaker response according to an indicator function.

FIG. 15 is a graph for an example of a loudspeaker response according to an indicator function.

Referring to FIG. 15, if an indicator function B(t) is 1 (i.e., the region of (3) shown in FIG. 14), a frequency response of a loudspeaker is not modified (an adaptive filter corresponds to a unity filter). Meanwhile, if an indicator function B(t) is 0 (i.e., the region of (1) shown in FIG. 14), a frequency response of a loudspeaker is fully corrected (an adaptive filter corresponds to an equalization filter). If an indicator function B(t) is greater than 0 and smaller than 1 (i.e., the region of (2) shown in FIG. 14), a frequency response of a loudspeaker is partially corrected (an adaptive filter corresponds to a combination of a unity filter and an equalization filter).

<Frequency Domain Implementation>

The method for the bass controlling unit to control the bass, which was described with reference to FIG. 11 and FIG. 12, can be implemented in time-frequency domain as well as time domain. In particular, this method is applicable to an input signal on which such frequency transform as filter bank, shot time Fourier transform and the like is applied. In this case, a power p(t) of a weight-applied signal can be estimated from a subband signal. And, filter operation can be replaced by multiplication in each subband (or frequency).

<Stereo Channel or Multi-Channel>

The method for the bass controlling unit to control the bass, which was described with reference to FIG. 11 and FIG. 12, is applicable to each channel signal of stereo- or multi-channel audio signal. Alternatively, an indicator unction B(t) (or a equalization boost parameter) can be jointly calculated for all signals using a power p(t) for a sum of all channel. Likewise, an adaptive filter g(t), which is determined by B(t), is applied to al channels.

The audio signal processing apparatus according to the present invention is available for various products to use. Theses products can be mainly grouped into a stand alone group and a portable group. A TV, a monitor, a settop box and the like can be included in the stand alone group. And, a PMP, a mobile phone, a navigation system and the like can be included in the portable group.

Figure 16:
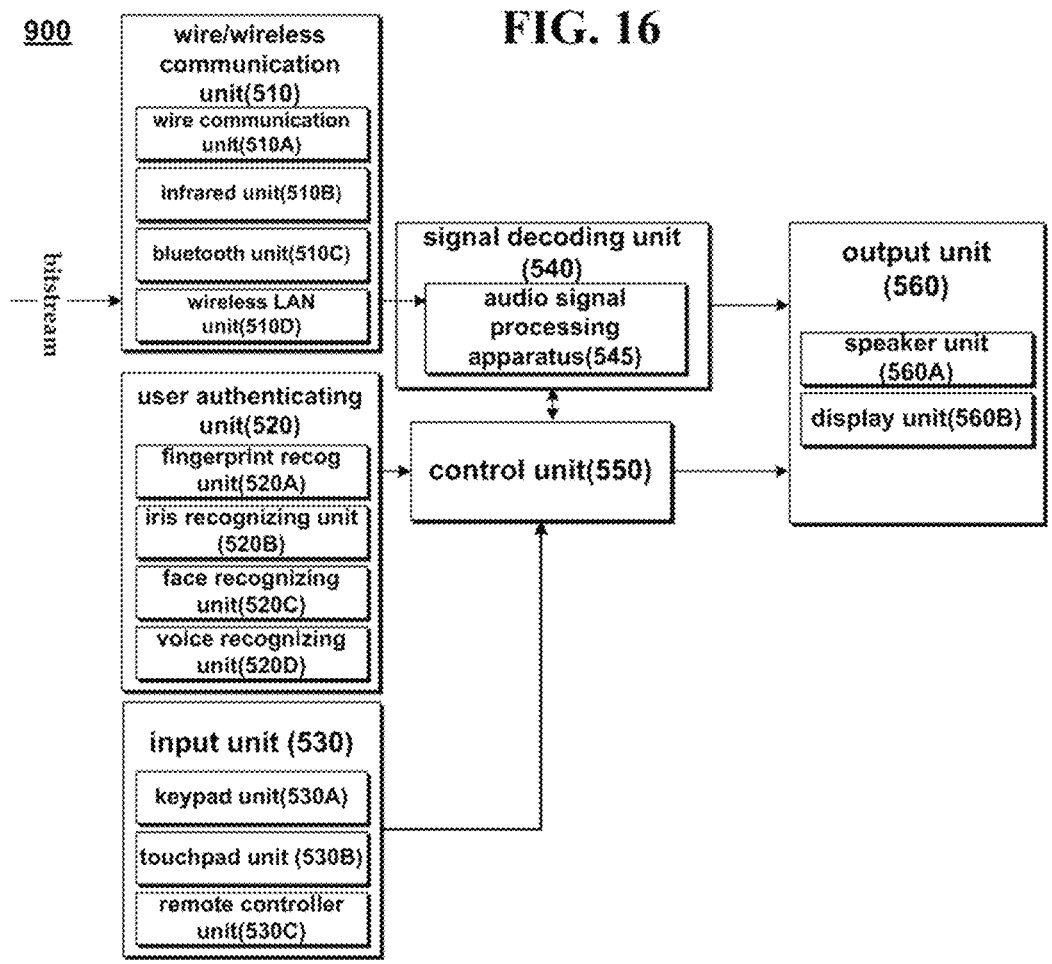
FIG. 16 is a schematic block diagram of a product in which an audio signal processing apparatus according to one embodiment of the present invention is implemented.
Figure 17:
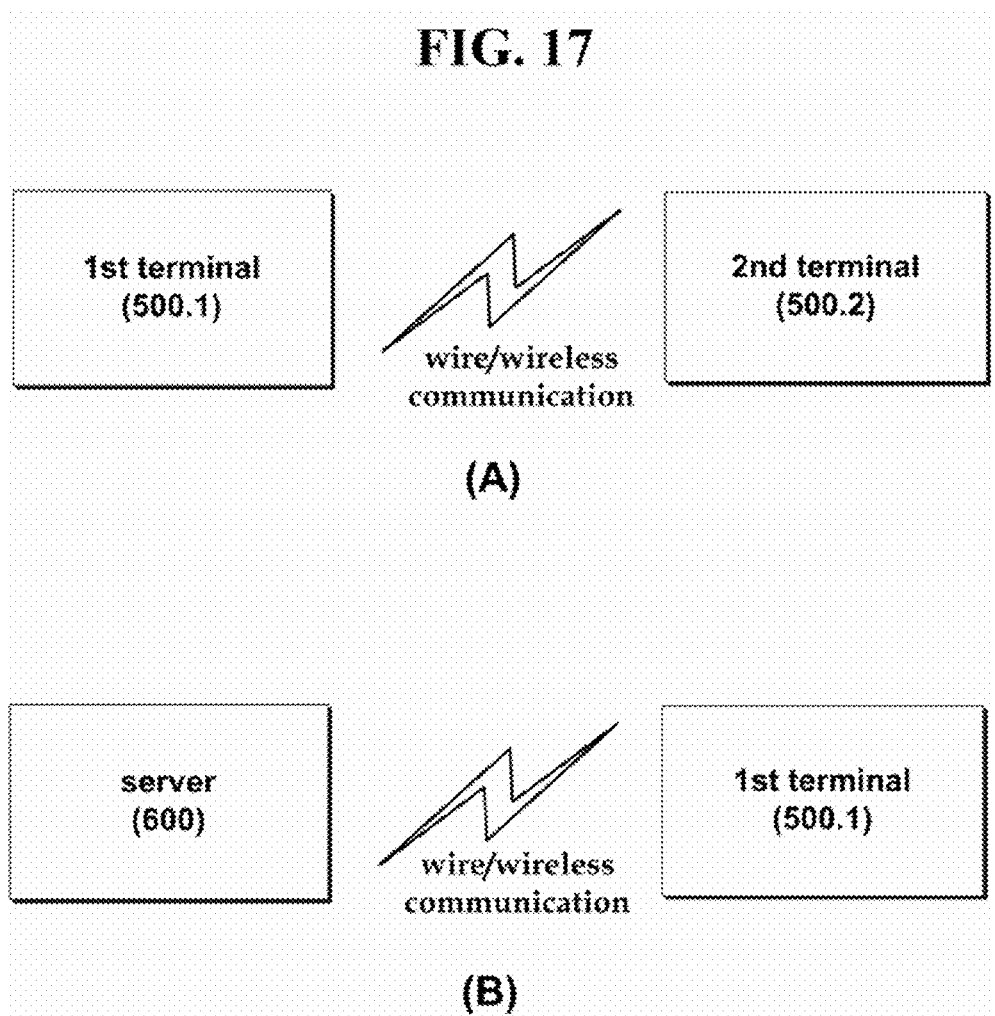
FIG. 17 is a diagram for explaining relations between products in which an audio signal processing apparatus according to one embodiment of the present invention is implemented.

FIG. 16 is a schematic block diagram of a product in which an audio signal processing apparatus according to one embodiment of the present invention is implemented. And, FIG. 17 is a diagram for explaining relations between products in which an audio signal processing apparatus according to one embodiment of the present invention is implemented.

Referring to FIG. 16, a wire/wireless communication unit 510 receives a bitstream via wire/wireless communication system. In particular, the wire/wireless communication unit 510 can include at least one of a wire communication unit 510A, an infrared unit 510B, a Bluetooth unit 510C and a wireless LAN unit 510D.

A user authenticating unit 520 receives an input of user information and then performs user authentication. The user authenticating unit 520 can include at least one of a fingerprint recognizing unit 520A, an iris recognizing unit 520B, a face recognizing unit 520C and a voice recognizing unit 520D. The fingerprint recognizing unit 520A, the iris recognizing unit 520B, the face recognizing unit 520C and the speech recognizing unit 520D receive fingerprint information, iris information, face contour information and voice information and then convert them into user informations, respectively. Whether each of the user informations matches pre-registered user data is determined to perform the user authentication.

An input unit 530 is an input device enabling a user to input various kinds of commands and can include at least one of a keypad unit 530A, a touchpad unit 530B and a remote controller unit 530C, by which the present invention is non-limited.

A signal coding unit 540 performs encoding or decoding on an audio signal and/or a video signal, which is received via the wire/wireless communication unit 510, and then outputs an audio signal in time domain. The signal coding unit 540 includes an audio signal processing apparatus 545. As mentioned in the foregoing description, the audio signal processing apparatus 545 corresponds to the above-described embodiment. Before an audio signal is outputted via the output unit, the audio signal processing apparatus 545 performs at least one of noise canceling, normalizing, volume control and bass control on the audio signal. Thus, the audio signal processing apparatus 545 and the signal coding unit including the same can be implemented by at least one or more processors.

A control unit 550 receives input signals from input devices and controls all processes of the signal decoding unit 540 and an output unit 560. In particular, the output unit 560 is an element configured to output an output signal generated by the signal decoding unit 540 and the like and can include a speaker unit 560A and a display unit 560B. If the output signal is an audio signal, it is outputted to a speaker. If the output signal is a video signal, it is outputted via a display.

FIG. 17 is a diagram for the relation between a terminal and server corresponding to the products shown in FIG. 16.

Referring to (A) of FIG. 17, it can be observed that a first terminal 500.1 and a second terminal 500.2 can exchange data or bitstreams bi-directionally with each other via the wire/wireless communication units. Referring to (B) of FIG. 17, it can be observed that a server 600 and a first terminal 500.1 can perform wire/wireless communication with each other.

An audio signal processing method according to the present invention can be implemented into a computer-executable program and can be stored in a computer-readable recording medium. And, multimedia data having a data structure of the present invention can be stored in the computer-readable recording medium. The computer-readable media include all kinds of recording devices in which data readable by a computer system are stored. The computer-readable media include ROM, RAM, CD-ROM, magnetic tapes, floppy discs, optical data storage devices, and the like. And, a bitstream generated by the above mentioned encoding method can be stored in the computer-readable recording medium or can be transmitted via wire/wireless communication network.

Accordingly, the present invention is applicable to processing and outputting of audio signals.

While the present invention has been described and illustrated herein with reference to the preferred embodiments thereof, it will be apparent to those skilled in the art that various modifications and variations can be made therein without departing from the spirit and scope of the invention. Thus, it is intended that the present invention covers the modifications and variations of this invention that come within the scope of the appended claims and their equivalents.

Accordingly, the present invention provides the following effects or advantages.

First of all, for a volume level in the vicinity of an absolute threshold of hearing, the present invention non-linearly controls a volume based on the absolute threshold of hearing, thereby preventing loudness of sound for a specific frequency band (e.g., a high frequency, a low frequency, etc.) from being inaudible or barely audible.

Secondly, in adjusting a volume into a level considerably higher than an absolute threshold of hearing, the present invention applies a non-linear gain, thereby controlling the volume efficiently despite that an output limit of a speaker is relatively low.

Thirdly, the present invention is able to distribute portions of linear and non-linear gains automatically according to whether a user gain is smaller than a reference value (e.g., high reference value and/or low reference value).

Fourthly, the present invention automatically adjusts a portion for modifying a frequency response of a loudspeaker according to whether a signal power is big or small, thereby enhancing bass adaptively.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for processing an audio signal, comprising:
   receiving, by an audio processing apparatus, an input signal;
   estimating an indicator function using a signal power of the input signal, a maximum power, and a minimum power;
   when the signal power is greater than the maximum power, setting an adapted filter to a unity filter;
   when the signal power is equal to or smaller than the maximum power and greater than the minimum power, setting the adapted filter using the unity filter, an equalization filter, and the indicator function;
   when the signal power is equal to or smaller than the minimum power, setting the adapted filter to the equalization filter; and
   generating an output signal by applying the adapted filter to the input signal.

2. The method of claim 1, wherein the signal power is generated using a weight filter and the input signal.

3. The method of claim 1, wherein the indicator function ranges from zero to one.

4. The method of claim 1, wherein the adapted filter extends bass without overdriving.

5. An apparatus for processing an audio signal, comprising:
   a receiving part configured to receive, by an audio processing apparatus, an input signal;
   an indicator function estimating part configured to estimate an indicator function using a signal power of the input signal, a maximum power, and a minimum power;
   a filter part configured to:
   set an adapted filter to a unity filter when the signal power is greater than the maximum power,
   set the adapted filter to a combination of the unity filter and an equalization filter when the signal power is equal to or smaller than the maximum power and greater than the minimum power, and
   set the adapted filter to the equalization filter when the signal power is equal to or smaller than the minimum power; and
   a filter applying part configured to generate an output signal by applying the adapted filter to the input signal.

6. The apparatus of claim 5, wherein the signal power is generated using a weight filter and the input signal.

7. The apparatus of claim 5, wherein the indicator function ranges from zero to one.

8. A non-transitory computer-readable medium having instructions stored thereon, which, when executed by a processor, causes the processor to operations comprising: receiving, by an audio processing apparatus, an input signal; estimating an indicator function using a signal power of the input signal, a maximum power, and a minimum power; when the signal power is greater than the maximum power, setting an adapted filter to a unity filter using, when the signal power is equal to or smaller than the maximum power and greater than the minimum power, setting the adapted filter to a combination of the unity filter and an equalization filter; when the signal power is equal to or smaller than the minimum power, setting the adapted filter to correspond to the equalization filter; and generating an output signal by applying the adapted filter to the input signal.

* * * * *